United States Patent [19]

Bailly

[11] 4,414,894
[45] Nov. 15, 1983

[54] SCREEN PRINTING APPARATUS

[75] Inventor: Emile Bailly, Les Lilas, France

[73] Assignee: Compagnie Internationale pour l'Informatique Cii-Honeywell Bull, Paris, France

[21] Appl. No.: 885,153

[22] Filed: Mar. 10, 1978

[30] Foreign Application Priority Data

Mar. 10, 1977 [FR] France .............................. 77 07044

[51] Int. Cl.³ .......................................... B41F 15/08
[52] U.S. Cl. .................................. 101/123; 101/126; 118/213
[58] Field of Search ............... 101/123, 126, DIG. 12, 101/127; 118/213, 7

[56] References Cited

U.S. PATENT DOCUMENTS

| | | | |
|---|---|---|---|
| 2,231,553 | 2/1941 | Soubier | 101/124 |
| 2,845,859 | 8/1958 | Gattuso | 101/126 |
| 2,968,239 | 1/1961 | Zumbehl | 101/126 X |
| 3,180,255 | 4/1965 | Christie | 101/123 |
| 3,486,441 | 12/1969 | Hillman et al. | 118/213 X |
| 3,543,679 | 12/1970 | Wahl | 101/126 X |
| 3,650,208 | 3/1972 | Lambert | 101/123 |
| 3,788,215 | 1/1974 | Lambert | 101/126 X |
| 3,943,849 | 3/1976 | Vasilantone | 101/123 |
| 3,948,170 | 4/1976 | Ericsson | 101/126 |
| 4,005,651 | 2/1977 | Sigel et al. | 101/127.1 |

FOREIGN PATENT DOCUMENTS

| | | | |
|---|---|---|---|
| 1140949 | 12/1962 | Fed. Rep. of Germany | 101/124 |
| 702298 | 3/1966 | Italy | 101/123 |
| 625108 | 6/1949 | United Kingdom | 101/123 |
| 1200137 | 7/1970 | United Kingdom | 101/123 |
| 419419 | 8/1974 | U.S.S.R. | 101/126 |
| 515661 | 9/1976 | U.S.S.R. | 101/123 |

Primary Examiner—John P. McIntosh
Attorney, Agent, or Firm—Lowe, King, Price & Becker

[57] ABSTRACT

A printing apparatus applies material to a carrier through a planar screen having a pattern including a number of lines substantially parallel to a first direction. The screen and carrier are mounted so material forced through the lines of the screen is deposited on the carrier in the same pattern as the pattern of the screen. A blade having an elongated, straight edge is positioned to force the material through the screen onto the carrier. The blade is supported and actuated so that the blade is displaced in a plane parallel to the plane of the screen and in a second direction. The second direction is adjustable to any angle with respect to the first direction, so that the blade can slide parallel to the lines in the screen.

6 Claims, 7 Drawing Figures

SCREEN PRINTING APPARATUS

FIELD OF THE INVENTION

The present invention relates to an apparatus for applying a layer of pasty material to a carrier through a screen; this apparatus being intended particularly, but not exclusively, for obtaining, by screen printing, circuits containing multiple thick-layer connections.

BACKGROUND OF THE INVENTION

Present-day techniques for manufacturing equipment intended for data processing are making ever greater use of compact circuits which enable the size of such equipment to be considerably reduced. These compact circuits are often produced in the form of printed circuits which are assembled together in a number of layers of electrical connecting panels and which may or may not be provided with electronic components which are normally formed by integrated circuits contained in housings. With the object of producing circuits of even higher performance and of grouping them into a space which, relatively speaking, is even smaller, manufacturers have been led to use tiny integrated circuit wafers, generally known as chips, in place of integrated circuits mounted in housings. The wafers are mounted on substrates having numerous conductors distributed on a number of levels. The levels are spaced from each other by insulating layers, except at certain predetermined points where conductive pillars provide electrical connections between conductors situated on different levels.

Such substrates are generally produced by means of screen-printing apparatus which deposits an alternating series of conducting and insulating layers on an electrically insulating carrier, of alumina for example. Each layer is formed by applying a pasty material, having a configuration of openings corresponding to that of the layer to be produced. After each layer has been applied, the carrier is removed from the screen-printing apparatus and placed in a high-temperature oven which solidifies the layer to form an insulating or metallic layer which adheres strongly to the carrier or the previous layer. To provide electrical connections between conductors situated at different levels, it is essential to position with extreme accuracy the screens which are successively fitted into the apparatus to enable accurate deposition of the layers. The layer receiving carrier must be positioned with equal accuracy relative to the screens each time it is inserted in the apparatus.

For these purposes, in the prior art each screen in mounted in a frame having two bores which fit over two pins in the screen printing apparatus. The screen can be shifted within the frame to allow a pattern of openings in the screen to be very accurately positioned relative to the two bores. Thereby, when the frames are inserted successively into the screen-printing apparatus, various opening patterns in the screens mounted in these frames are exactly positioned with respect to the two pins.

In screen-printing apparatus produced hitherto, these two pins are attached to a horizontal plate and the pasty material is applied through the pattern of openings in the screen inserted in the apparatus by a blade. The blade is mounted on guide means attached to the plate so it is able to slide horizontally in a straight line. To allow an operator to gain access to this blade, to clean it for example, the plate is mounted to pivot about a horizontal shaft that extends perpendicular to the blade direction of movement.

Such apparatus is also fitted with a movable carriage on which the carrier which is to receive a layer is positioned. The carriage can be moved parallel to the plane of a screen previously inserted in the apparatus to enable the carrier positioned on the carriage to be brought underneath the pattern of openings in the screen.

However, such screen-printing apparatus has certain deficiencies because it is not possible to position the carriage under the screen with great accuracy. In addition, hinging of the plate on a horizontal shaft necessarily introduces some play, which prevents screens mounted on the two pins on the plate from being accurately positioned in relation to fixed parts of the apparatus.

Because the insulating layers which separate the conductor layers of the substrate are extremely thin, it has been found necessary, to overcome cross-talk between conductors on different layers, to arrange the conductors in such a way that the conductors lie practically parallel to one another on each individual level. The conductors on immediately adjacent levels extend perpendicular to each other. Hence, the patterns of openings in the screens which are successively inserted in the screen-printing apparatus consist, in essence, of lines which are substantially parallel to one another. These lines, when the corresponding screen is positioned in the apparatus, are orientated virtually either parallel or perpendicular to the direction of blade movement. However, in cases where the lines lie perpendicular to the blade movement direction, it becomes increasingly difficult to obtain on the carrier or on the insulating layer deposited previously, a deposit of pasty material which exactly follows the outline of the pattern of openings as the width of these lines becomes very small, that is to say less than a few hundred microns.

BRIEF DESCRIPTION OF THE INVENTION

The present invention seeks to overcome these disadvantages and proposes an apparatus for applying a layer of pasty material to a carrier through a screen. The invention enables a succession of relatively precisely positioned layers to be deposited on the carrier. The configuration of each of these layers precisely follows the outline of the pattern of openings in the screen which is used to produce the layer.

One aspect of the invention relates to an apparatus for applying a layer of pasty material to a carrier through a screen, which is characterized as including a platen to receive the carrier. The blade and screen are arranged so that the blade is always driven in the same direction as the vast majority of lines in the screen so the pasty material is spread in a direction parallel to the lines. To these ends, there is provided a screen essentially having a number of lines substantially parallel to a first predetermined direction and a blade. Blade supporting and actuating means displace the blade on the screen in a second direction. The blade supporting and actuating means include means for adjusting the second direction to any angle with respect to said first direction, whereby the blade can slide parallel to said lines in the screen.

The above and still further objects, features and advantages of the present invention will become apparent upon consideration of the following detailed description

DETAILED DESCRIPTION OF THE DRAWING

Figure 1:
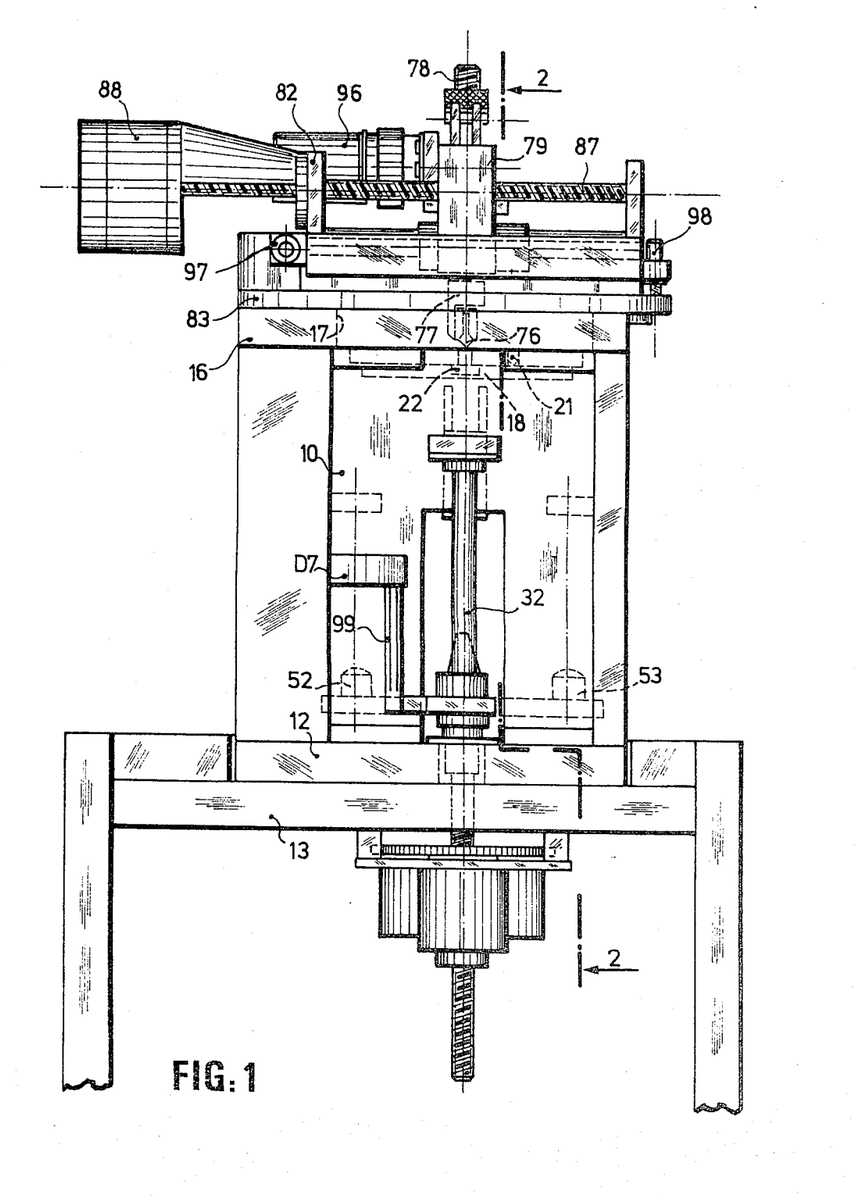
FIG. 1 is an elevational view of one embodiment of a screen-printing apparatus formed in accordance with the invention.
Figure 2:
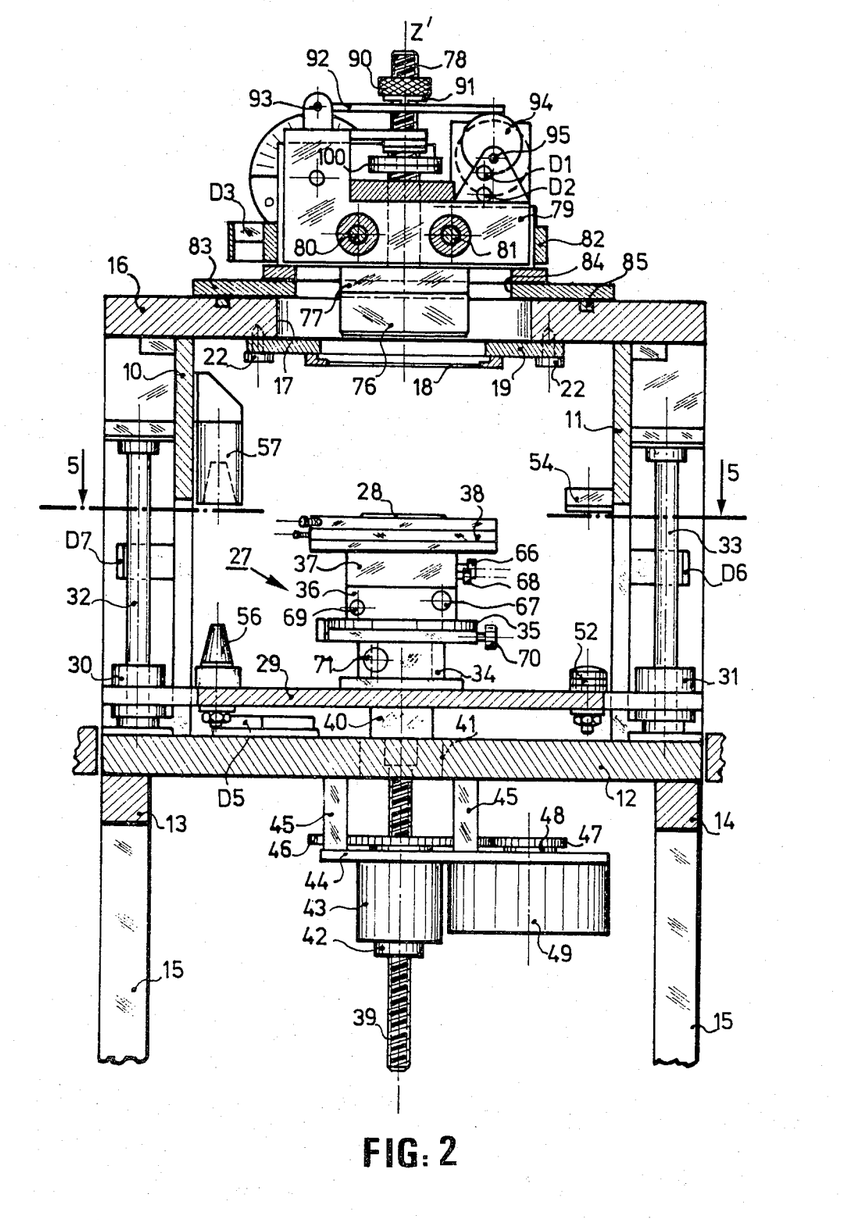
FIG. 2 is a partial cross-sectional view of the apparatus shown in FIG. 1, taken on the dotted line and looking in the direction of arrows 2—2.
Figure 3:
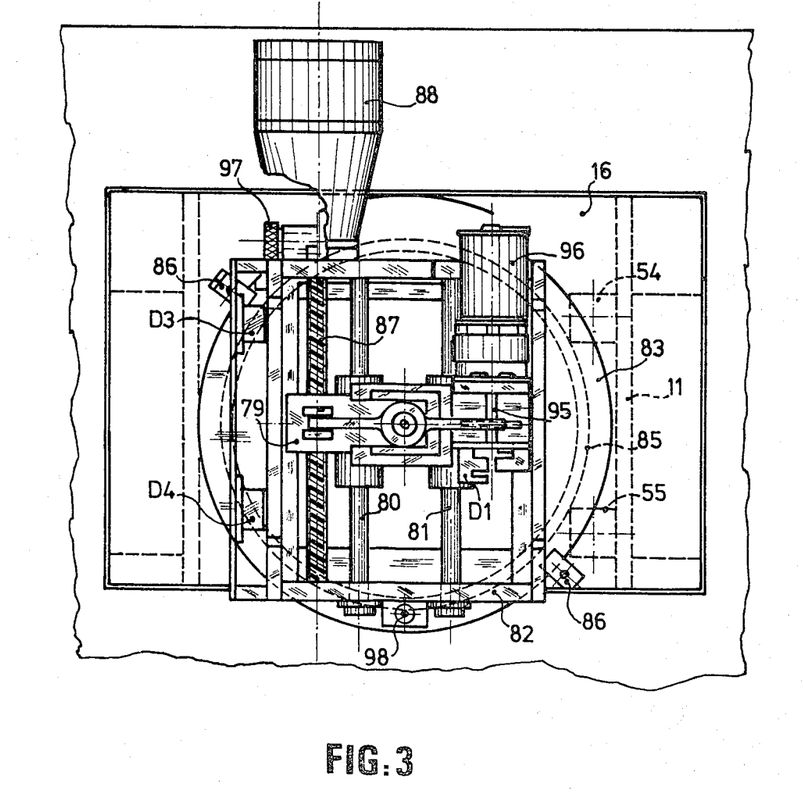
FIG. 3 is a plan view, partly cut-away, of the apparatus shown in FIG. 1.

In FIGS. 1, 2 and 3 are illustrated the main parts of a screen-printing apparatus which enables multilayer substrates with a high circuit density to be produced. As can be seen in these Figures, this apparatus has a π-shaped frame formed by two vertical side-plates 10 and 11, attached to a bed 12 which rests on two cross-pieces 13 and 14 supported by legs 15; plates 10 and 11 being connected at their upper ends by a horizontal support plate 16. Support plate 16 is provided with a circular opening 17 under which a screen-printing screen 18, fitted to a frame 19, may be positioned so as to cover the opening, as shown in FIGS. 1 and 2.

Figure 4:
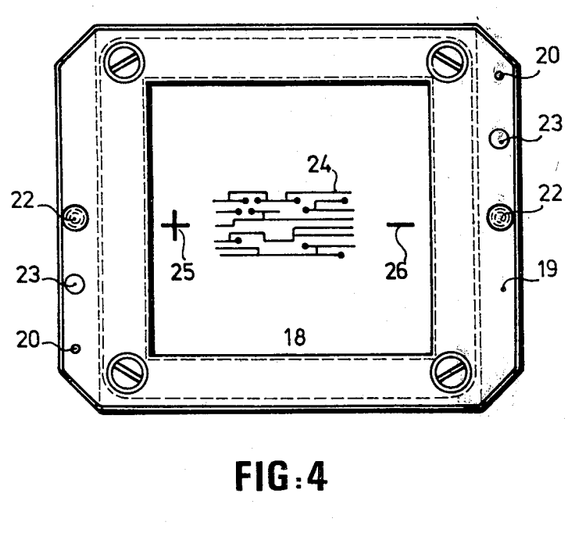
FIG. 4 is a plan view of a screen-printing screen fitted to its frame.

The assembly formed by the screen 18 and the frame 19, which can be withdrawn from the screen-printing apparatus, is shown schematically in FIG. 4. Frame 19 is provided with two bores 20 into which two corresponding pins in the screen-printing apparatus may be inserted, thus enabling the screen and frame assembly to be positioned in the apparatus with extreme accuracy. For reasons of simplicity only one of the two pins, indicated by reference numeral 21, is shown in FIG. 1. Frame 19 is additionally fitted with two screws 22 which, when screwed into the screen-printing apparatus, hold the screen and frame assembly in position against the lower face of the support plate 16, as can be seen in FIG. 2. The manufacturing tolerance of bores 20, which cooperate with the pins 21, is of the order of a few microns so it is virtually impossible for the frame 19 to be removed manually from the pins 21 after the frame has been engaged on the pins. It is for this reason that the frame 19 incorporates two screws 23 (FIG. 4) which, when screwed in, bear against the lower face of the support plate 16 and thus enable the frame 19 to be released from the pins 21 of the apparatus without the risk of damaging the pins.

In FIG. 4, the pattern of openings in the screen 18 is shown by reference numeral 24. This pattern of openings 24, which lies substantially at the center of screen 18, is enclosed by two marks 25 and 26; mark 25 is formed by a cross while mark 26 is formed by a line. Marks 25 and 26 position patterns 24 very accurately relative to bores 20. A setting-up operation, which is performed before the assembly formed by the screen 18 and the frame 19 is inserted in the screen printing apparatus, may, for example, be carried out by a pattern setting-up device which is illustrated and described in French Pat. No. 2,182,298.

Referring again to FIG. 2, the screen printing apparatus includes a platen 38 on which an insulating carrier 28 is placed so the carrier can be brought into contact with a screen 18 which has previously been inserted in the apparatus; carrier 28 may, for example, be alumina, which is or is not covered with one or more insulating or conductive layers. Platen 38 is attached to a setting-up unit 27 arranged on a horizontal plate 29 fitted with two bushings 30 and 31 which are respectively slidable on two vertical rods 32 and 33 fixedly secured to the frame of the apparatus; rods 32 and 33 respectively extend upwardly alongside vertical plates 10 and 11.

Setting up unit 27 includes a slide member 34 which is attached to the plate 29 and which carries a swiveling ring 35. On ring 35 are in turn mounted two superimposed plates 36 and 37 which form two mutually orthogonal horizontal sliders. A threaded spindle 39 which is arranged in a vertical position underneath plate 29 is attached at its upper end to a bearer block 40 secured to plate 29. The threaded spindle 39, which passes freely through an opening 41 in the bed 12, is engaged in an internally threaded sleeve 42. The sleeve 42 is housed in a socket 43 and is able to turn in the latter without being able to escape from it; socket 43 is attached to a horizontal carrier plate 44 arranged below the bed 12 which is attached to the plate by fixed straps 45. The internally threaded sleeve 42 is attached to a gear wheel 46 which meshes with a pinion 47, mounted on drive shaft 48 of an electric motor 49 attached to the carrier plate 44.

Components 34, 35, 36, 37, 38, 39, 40, 42 and 43, which have just been described, and the assembly of screen 18 and frame 19 which is inserted in the apparatus, are centered on vertical axis ZZ' which passes through the center of the opening 17 in the support plate 16. This being the case, if the motor 49 is energized to turn in a direction such that the sleeve 42, when turned by pinion 47 and gear 46, raises the threaded spindle 39 and the plate 29, attached to this spindle, setting-up unit 27, which is attached to the plate 29, rises towards screen 18. The upward movement continues until carrier 28, in position on platen 38, mounted on the setting-up unit 27, contacts screen 18.

Figure 5:
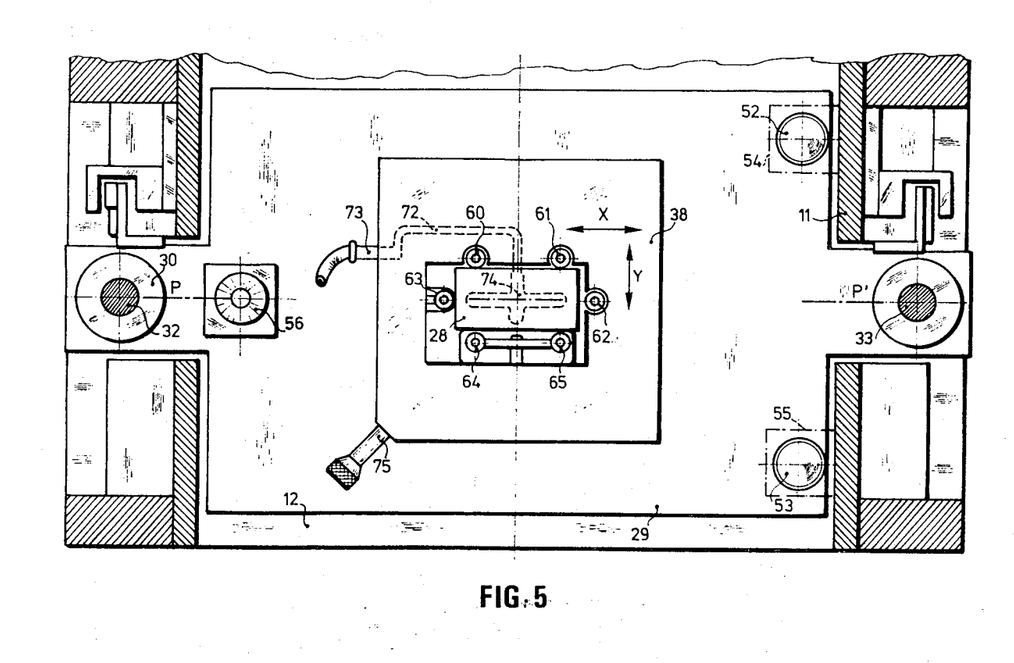
FIG. 5 is a sectional view of the apparatus on the line 5—5 in FIG. 2.

To enable carrier 28 to be exactly positioned relative to screen 18, the screen-printing apparatus is fitted with locating means. The locating means includes two studs 52 and 53 (FIGS. 1 and 5) mounted on plate 29 next to vertical plate 11 and on either side of vertical plane PP' which passes through the axes of rods 32 and 33. The upward movement of the plate 29 and the unit 27, which it carries, is halted by two stops 54 and 55, against which studs 52 and 53 respectively come to bear when carrier 28 contacts screen 18; stops 54 and 55 being attached to plate 11, as can be seen in FIGS. 2, 3 and 5. Plate 29 is also fitted with a conically shaped locating dowel 56 (FIGS. 2 and 5), which is arranged in a vertical position near bushing 30. At the end of the upward movement of the assembly 27, dowel 56 mates with a conical cavity in locating socket 57 (FIG. 2), attached to upright 10. The cavity of socket 57 is machined in such a way that its female, conical surface exactly mates with the male, conical surface of dowel 56 when studs 52 and 53 respectively contact stops 54 and 55. Hence, at the end of the upward movement of the assembly 27, the male, conical surface contacts the conical surface of the cavity in the socket 57. In addition, when studs 52 and 53 are respectively pressed against stops 54 and 55, plate 29 is in a precisely defined and absolutely unvarying position relative to the frame of the apparatus and to the screen-printing screen 18 inserted in the apparatus.

At the end of the upward movement it is important for carrier 28, in position on platen 38, mounted on the plate 29, to occupy on exactly defined position relative to the screen 18 with which it has been brought into contact. To achieve this result, there are provided, on the upper face of the platen 38, three rollers 60, 61 and 62 (FIG. 5) against which bear one of the longitudinal edges and one of the transverse edges of carrier 28; carrier 28 is urged against rollers 60, 61 and 62 by pressure exerted against the opposite edges of the carrier by three pressure rollers 63, 64 and 65. Because one longitudinal edge of carrier 28 is pressed against the rollers 60 and 61 and one transverse edge of the carrier is pressed against roller 62, the carrier is exactly positioned relative to platen 38.

Plates 36 and 37 (FIG. 2), on which platen 38 is mounted, form mutually orthogonal sliders that allow platen 38 to be shifted horizontally in two mutually perpendicular directions, respectively shown as X and Y in FIG. 5; hence the center of carrier 28, which has been positioned on the platen, can be moved into the vertical axis ZZ'. The displacements of platen 38 in the X and Y directions are respectively controlled by knurled headed screws 66 and 67 (FIG. 2), respectively arranged in plates 36 and 37. Two screws 68 and 69 associated with plates 37 and 36 respectively enable an operator to lock each of the two plates once the displacements have been completed. Furthermore, it may also be necessary to rotate the carrier 28 in its plane to bring a straight line joining the centers of rollers 60 and 61 parallel to a straight line connecting marks 25 and 26 on the screen 18 that has been inserted in the machine. This rotary movement, which is of the order of a few degrees, for example 5°, at the maximum, is achieved by operating a knurled headed screw 70, that turns swiveling ring 35. When all these adjustments have been made, the carrier 28, in position on platen 38, is in an exactly defined position relative to the screen 18 which has previously been inserted in the apparatus. When plate 29 has been raised to its highest position, the contact between carrier 28 and screen 18 may be accurately adjusted by operating a knurled-head screw 71 which is mounted in slide member 34 and allows the assembly, formed by the ring 35, plates 36 and 37 and plate 38, to be raised or lowered; the amount of this movement is relatively small however, being less than a centimeter for example.

Referring again to FIG. 5, a passage 72 in platen 38 is connected by a nozzle 73 to a vacuum device (not shown); nozzle 73 opens into the platen through an opening 74. In this way, carrier 28, positioned on platen 38, is held in position by suction. Pressure rollers 63, 64 and 65 are under the control of an actuating rod 75, which, when operated by the operator, withdraws these three rollers from carrier 28 to enable the operator to remove the carrier from platen 38 once the suction is shut off.

As can be seen from reference to FIGS. 1 and 2, circular opening 17, provided in horizontal support plate 16, enables blade 76 to come into contact with the screen-printing screen 18, inserted in the apparatus to apply a layer of a pasty material. The pasty material is deposited on a pattern of openings in and through the screen 18 so that the pasty material is deposited on the carrier 28 which has previously been brought against the screen. The blade 76 is mounted on a blade carrier 77, attached to the lower end of a vertical spindle 78. As described infra, spindle 78 is carried on movable carrier 79 which is mounted to slide on two parallel horizontal guide rods 80 and 81 (FIGS. 2 and 3). Rods 80 and 81 are attached to a frame 82 mounted on a movable annular plate with a central opening 84. Plate 83 rests on horizontal support plate 16 and is able to pivot about the vertical axis ZZ'. In the embodiment illustrated in FIGS. 2 and 3, the lower face of plate 83 is provided with an annular ridge 85 which engages a corresponding annular channel in the upper face of support plate 16 and which allows the operator to turn plate 83 and the various parts mounted on it about axis ZZ'. Clips 86 (FIG. 3) attached to the upper face of the support plate 16, prevent the ridge 85 from escaping from its channel. As seen in FIGS. 1 and 3, movable carriage 79 is engaged with a threaded spindle 87 that extends parallel to guide rods 80 and 81 and turns in frame 82. Electric motor 88, attached to the frame 82, rotatably drives spindle 87, which in turn slidably drives carriage 79 on rods 80 and 81.

As can be seen in FIG. 2, the upper part of vertical spindle 78, slidably mounted on carriage 79, is threaded so it can be retained by a nut 100. Because nut 100 is screwed onto the threaded part of spindle 78, the nut comes to rest against carriage 79 when blade 76 contacts screen-printing screen 18. A second nut 90, also screwed onto the threaded part of spindle 78, enables the spindle to be operated by an actuating lever 92, articulated at one of its ends to a shaft 93 secured to carriage 79. Support for spindle 78 from lever 92 is provided by washer 91 which incorporates a knife edge and is inserted between nut 90 and lever 92, as shown in FIG. 2. The other end of lever 92 is pressed against a cam 94 which is fixedly carried by shaft 95 (FIGS. 2 and 3), in turn driven by motor 96 that is mounted on carriage 79.

In FIG. 2, cam 94 is shown in the raised position, the position it normally occupies when the screen-printing apparatus is at rest. In this position, blade 76 is spaced away from screen-printing screen 18, as shown in FIG. 2. If motor 96 is then energized to turn shaft 95 one half a revolution, cam 94 is driven to the lowered position so lever 92 pivots about shaft 93, allowing the assembly formed by spindle 78, blade 76, blade carrier 77, nut 90 and washer 91 to descend on spindle 78. Nuts 90 and 100 cause the assembly to be so adjusted that when cam 94 is in the lowered position, blade 76 rests against the screen-printing screen 18. Two position detectors D1 and D2 which are two photoelectric cells in the preferred embodiment, are mounted on carriage 79 to detect, respectively, when cam 94 reaches its raised and lowered positions. These two detectors form part of an electrical control and monitoring circuit described infra.

Carriage 79, which slides on rods 80 and 81, can be moved between first and second extreme positions. The first extreme position is normally occupied by carriage 79 when the screen-printing apparatus is at rest; the presence of carriage 79 at this first extreme position being detected by a third photoelectric detector D3 (FIG. 3). In the second extreme position, carriage 79 is aligned with a fourth detector D4 (FIG. 3). After the appropriate pasty material has been deposited on screen-printing screen 18 and after motor 96 has been energized to bring blade 76 into contact with the screen, motor 88 drives carriage 79 from its first extreme position towards its second extreme position causing blade 76 to spread this pasty material across the screen 18 and apply it through the pattern of openings 24 in the screen to the carrier 28, previously brought into contact with the screen. In cases, such as illustrated in FIG. 4, where the pattern of openings 24, in essence, consists of lines extending in substantially the same direction, plate 83 is rotated until carriage guide rods 80 and 81 are parallel to the line direction and motors 96 and 88 are then energized. In this case, when blade 76 is then driven forward by carriage 79, the pasty material is spread across the screen 18 in the same direction as the lines so a deposit of pasty material on the carrier 28 is pressed against the screen 18, having a configuration exactly matching the outline of the pattern of openings 24.

As shown in FIGS. 1 and 3, frame 82 is hinged to annular plate 83 by horizontal shaft 97 that extends transversely to guide rods 80 and 81. By tilting frame 82 about shaft 97, the operator can easily gain access to blade 76, to clean it, for example, without having to remove screen-printing screen 18 for this purpose. When the apparatus is operating, the frame 82 is held fixed on part 83 by screw 98.

As illustrated in FIG. 2, there is a fifth detector D5, mounted on bed 12, to detect whether the plate 29 is or is not in its rest position; the rest position being that position normally occupied by plate 29 when the screen-printing apparatus is not being used and the plate is in its lowest position, as shown in FIG. 2. Sixth detector D6, attached to vertical plate 11, detects whether or not the plate 29 is in its highest position, i.e., the position occupied by plate 29 when the carrier 28, in position on platen 38, contacts screen 18. As seen in FIG. 1, plate 29 is fitted with a vertical bar 99 which translates past detector D7 when plate 29 is driven by motor 49. Bar 99 is adjusted to excite detector D7 as long as the distance between screen 18 and carrier 28, in position on platen 38, is less than a predetermined value, e.g., 5 mm, which represents the distance between the screen 18 and the carrier 28 when the upward speed of plate 29 should be decreased to enable carrier 28 to bear against the screen 18 without injury.

In the preferred described embodiment, each of the detectors D1 to D7 is formed by a photoelectric cell which normally receives a light beam emitted by a light source (not shown in the drawings). In response to the beam being incident on the photocell, the cell generates a finite output voltage. The voltage drops to zero when a movable part passes between the cell and the light source to interrupt the beam.

Figure 6:
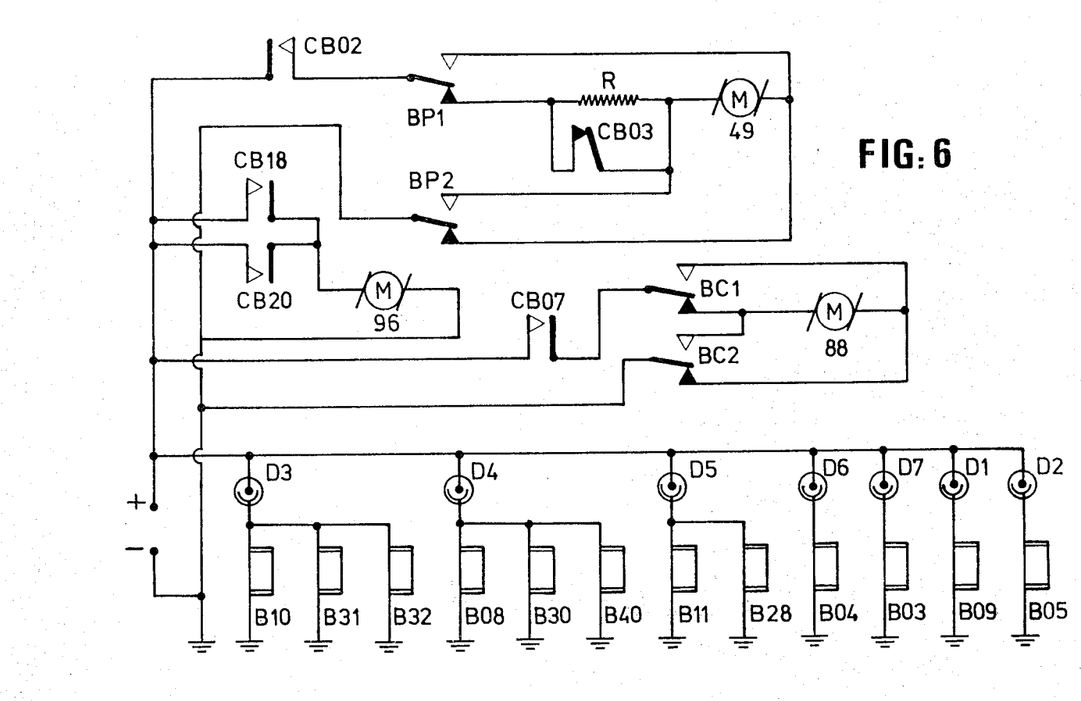
FIG. 6 is a partial circuit diagram of the electrical circuits for controlling and monitoring the screen-printing apparatus.
Figure 7:
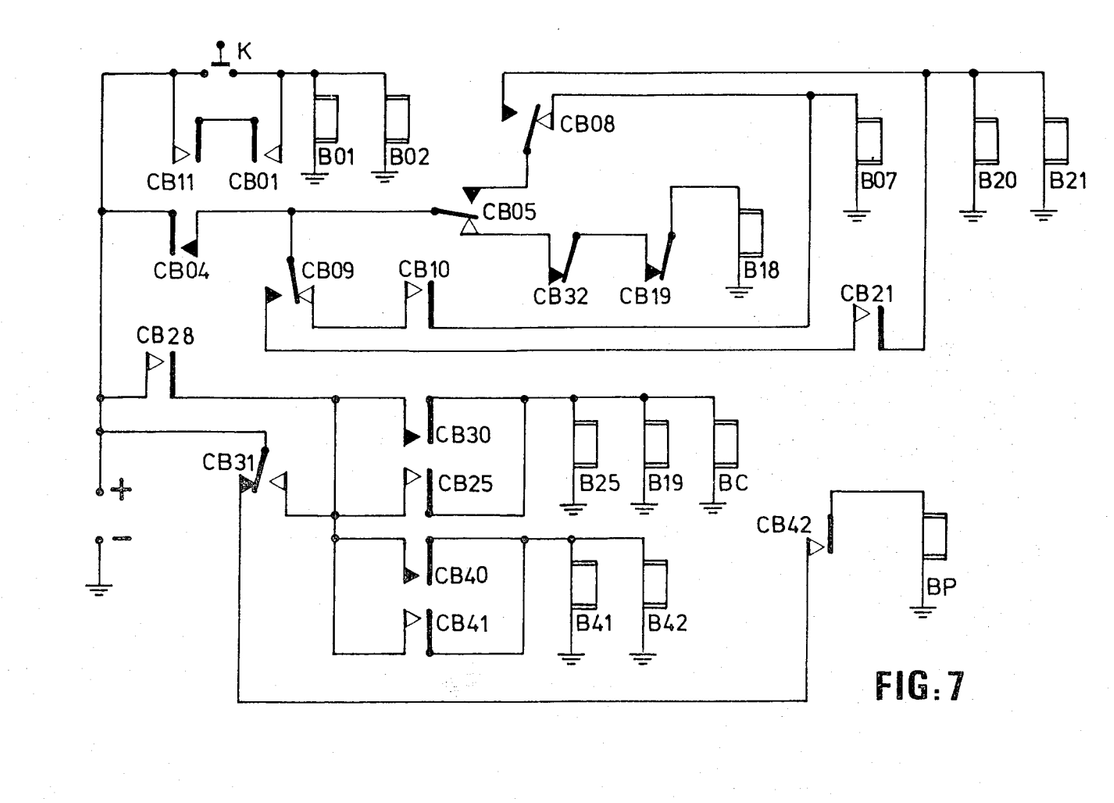
FIG. 7 is another partial circuit diagram of the circuits for controlling and monitoring the screen-printing apparatus.

There will now be described, with reference to FIGS. 6 and 7, an electrical control circuit to control the upward and downward movements of plate 29 and the movements of blade 76. The circuit diagram shown in FIGS. 6 and 7 is a general diagram which includes manually operated contacts and relay contacts intended for use under the conditions which are about to be described. The relay contacts are designated by the same references as the coils which control them, but with the letter C prefixed. A contact which is normally closed when the coil of the relay which controls it is not energized is represented in the diagram by a black triangle. Motors 49, 88 and 96, and the relays shown in FIGS. 6 and 7, are normally fed by DC current between two terminals (+) and (−).

When the apparatus is not operating, movable plate 29 is in its rest position close to bed 12. Plate 29 then interrupts the light beam which is transmitted towards detector D5 so no positive voltage appears at the output of detector D5. Hence, relays B11 and B28 (FIG. 6), connected to the output of D5, are not energized. Contracts CB11 and CB28 (FIG. 7), controlled by these relays, are thus open. Since the light beams which are transmitted towards detectors D6 and D7 are not interrupted, positive voltages appear at the outputs of both these detectors causing relays B04 and B03 (FIG. 6), connected to the outputs of detectors D6 and D7 respectively, to be energized. Hence, contact CB03 of relay B03 is closed while contact CB04 (FIG. 7) of relay B04 is open. Since cam 94 is in the raised position, the light beams transmitted towards detectors D1 and D2 are not interrupted. Positive voltages thus appear at the outputs of detectors D1 and D2 to energize two relays B09 and B05 (FIG. 6), respectively connected to the outputs of detectors D1 and D2. Because relays B09 and B05 are energized, contacts CB09 and CB05 (FIG. 7) thereof are in the working position. In addition, carriage 79, being in its first extreme position, interrupts the light beam transmitted towards detector D3, to de-activate three relays B10, B31 and B32 (FIG. 6), which are connected to the output of detector D3. Because relay B10 is de-energized, its contact CB10 (FIG. 7) is held open, while contact CB32 of de-energized relay B32 is closed. Because relay B31 is not energized, contact CB31 is held in the rest position. If carriage 79 is not interrupting the light beam transmitted towards detector D4, a positive voltage appears at the output of this detector and energizes three relays B08, B30 and B40 (FIG. 6) connected to this output. Being energized, relays B30 and B40 hold their contacts CB30 and CB40 (FIG. 7) open while relay B8, being energized, holds its contact CB08 in the working position.

By using suitable means, not shown, the operator is able, by using screws 66, 67, 68, 69, 70 and 71, to shift platen 38 so rollers 60, 61 and 62 occupy an accurately established position relative to the pattern in the screen 18 inserted in the apparatus. When this operation has been completed, a carrier 28 may be placed on the platen and held against it by suction, the carrier being pressed against rollers 60, 61 and 62 in the manner indicated above. When this operation has been completed, the operator places a little pasty material on the screen 18. The operator then presses a manual push-switch K (FIG. 7) and holds it closed until, as will be seen infra, contact CB11 closes, causing a DC current to flow from terminal (+) through closed switch K to energize relays B01 and B02. Energization of relay B01 causes its contact CB01 to close. Energization of relay B02 causes its contact CB02 to close. Under these conditions an electrical circuit is closed; the closed circuit comprises the (+) terminal, closed contact CB02, changeover contact BP1 in the rest position, closed contact CB03, motor 49, changeover contact BP2 in the rest position and the (−) terminal. Motor 49 is energized so its output shaft drives threaded spindle 39 upwardly, whereby plate 29, setting-up unit 27, platen 38 and carrier 28 are driven. During the upward movement of spindle 39, plate 29 no longer blocks the light beam transmitted towards detector D5 so the detector derives a positive voltage that energizes relays B11 and B28. Being energized, relay B28 closes its contact CB28 (FIG. 7). Similarly, energization of relay B11 causes its contact CB11 to close, establishing a circuit to hold in relays B01 and B02, even if the operator should stop pressing manual switch K at this time.

The ascent of plate 29, at a relatively high speed of the order of 10 cm per second, continues until plate 29 no longer interrupts the light beam transmitted towards detector D7. At this time, detector D7 derives a positive voltage causing energization of relay B03 whereby the relay contact CB03 is open and motor 49 is fed by a current which flows through a resistor R connected in parallel with the terminals of contact CB03, as shown in FIG. 6. Because resistor R is connected to motor 49, plate 29 rises at reduced speed of the order of 5 mm per second. The ascent of plate 29 continues until plate 29 is brought to a halt by stops 54 and 55 and locating dowel 56 is engaged in the cavity of socket 57.

In this position, carrier 28 is positively pressed against screen-printing screen 18 because energization of motor 49 continues; known slip means (not described) is provided to enable the motor shaft to slip to avoid the possibility of damage to the parts. Because plate 29 has arrived at and is sustained at its highest position, the plate interrupts the light beam which is transmitted towards detector D6. The positive voltage at the output of detector D6 then drops to zero causing relay B04 to be de-energized, whereby its contact CB04 closes.

A DC current then flows from the (+) terminal, through closed contact CB04, changeover contact CB05 in the working position, closed contact CB32 and a closed contact CB19 (described infra) to energize relay B18. Being energized, relay B18 closes its contact CB18 (FIG. 6). Closure of contact CB18 energizes motor 96 which drives cam 94. Cam 94 then moves away from its raised position, allowing the assembly formed by spindle 78, blade-carrier 77 and blade 76 to descend. During this movement, cam 94 interrupts the light beam which is transmitted towards detector D1. Because of this, relay B09, connected to the output of D1, is de-energized and its contact CB09 is changed over to the rest position. Blade 76 comes into contact with the screen-printing screen 18 slightly before the cam 94 reaches its lowest position.

When cam 94 reaches its lowest position, it interrupts the light beam transmitted towards detector D2. This causes de-energization of relay B05, connected to the output of detector D2, so the relay contact CB05 changes over to the rest position. As a result of this changeover, relay B18 is de-energized and opens its contact CB18, so the supply to motor 96 is cut off and cam 94 stops in the lowered position. Also, because of the changeover of contact CB05, a DC current now flows from the (+) terminal, through the closed contact CB04, the changeover contact CB05 in the rest position, and the changeover contact CB08 in the working position, to energize relay B07. Being energized, relay B07 closes its contact CB07 (FIG. 6). An electrical circuit consisting of the (+) terminal, contact CB07, a changeover contact BC1 in the rest position, motor 88, a changeover contact BC2 in the rest position, and the (−) terminal is then closed. This being the case, motor 88 is energized to drive carriage 79 via the threaded spindle 87. Carriage 79 then leaves its first extreme position and moves toward its second extreme position so blade 78 is translated to apply the pasty material to the carrier 28 through the pattern of openings in the screen 18.

During the movement of blade 78, carriage 79 no longer interrupts the light beam which is transmitted towards detector D3, causing energization of relays B10, B31 and B32, connected to the output of detector D3. Energization of relays B10 and B32 causes their contacts CB10 and CB32 to be respectively closed and opened, while energization of relay B31 causes its contact CB31 to change over to the working position. When carriage 79 reaches its second extreme position and interrupts the light beam transmitted towards detector D4, relays B08 and B30 and B40 are de-energized. Being de-energized, relay B08 changes its contact CB08 over to the rest position, the effect of which is, on the one hand, to energize two relays B20 and B21, discussed below, and on the other hand, to de-energize relay B07, thus causing motor 88 to stop because contact CB07 opens and carriage 79 stops in its second extreme position. In addition, de-energized relay B40 closes its contact CB40 (FIG. 7). A DC current then flows from the (+) terminal through the closed contacts CB28 and CB40 and energizes two relays B41 and B42. Being energized, contact CB41 of relay B41 closes to establish a hold-up circuit for itself and for relay B42. Being energized, relay B42 closes its contact CB42. Similarly, relay B30, being de-energized, closes its contact CB30. A DC current then flows from the (+) terminal through the closed contacts CB28 and CB30 to energize three relays B28, B29 and BC. Being energized, relay B25 closes its contact CB25 to establish a hold-on circuit for itself and for relays B19 and BC. Being energized, relay B19 opens its contact CB19 while relay BC, being energized, changes its contacts BC1 and BC2 (FIG. 6) over to the working position.

Because the changeover of contact CB08 to the rest position has the effect of energizing relays B20 and B21, contact CB21 of relay B21 is now closed, which establishes a hold-on circuit for these two relays. Being energized, relay B20 closes its contact CB20 (FIG. 6) causing energization of motor 96 which drives cam 94 upwardly away from its lowered position. The upward movement of cam 94 raises the assembly formed by spindle 78, blade carrier 77 and blade 76 so the blade moves away from screen 18. During this movement, cam 94 no longer interrupts the light beam which is transmitted towards detector D2. The positive voltage which then appears at the output of detector D2 is applied to relay B05 which, being energized, changes its contact CB05 over to the working position. This changeover has no effect on the supply to motor 88 however, because relay B20 continues to be energized by the current flowing from the (+) terminal through closed contact CB04, contact CB09 in the rest position, and closed contact CB21. Under these conditions, contact CB20 remains closed and cam 94, being driven by motor 96, continues to move towards its raised position.

When cam 94 reaches the raised position, it no longer blocks the light beam transmitted towards detector D1. A positive voltage then derived at the output of detector D1 energizes relay B09, causing its contact CB09 to change over to the working position. As a result of this changeover, relays B20 and B21 are de-energized and open their contact CB20 and CB21, so motor 96 stops and cam 94 halts in the raised position. In addition, because contact CB09 is now in the working position, a DC current flows from the (+) terminal, through closed contact CB04, contact CB09 in the working position, and the closed contact CB10, to energize relay B07, which closes its contact CB07.

Closure of contact CB07 causes motor 88 to then energize, but since changeover contacts BC1 and BC2 are now in the working position, the motor turns in a direction such that carriage 79 is driven away from its second extreme position towards its first extreme position. Carriage 79 thus no longer interrupts the light beam transmitted towards detector D4 which therefore derives a positive voltage that energizes relays B08, B30 and B40. Because relays B30 and B40 are energized, their contacts CB30 and CB40 open; however, the opening of contacts CB30 and CB40 has no effect on the energization of relays B41, B42, B25, B19 and BC, since contacts CB25, CB41 remain closed. Relay B08, being energized, changes its contact CB08 over to the working position. While carriage 79 returns towards its first extreme position, blade 76 is spaced away from screen 18 because cam 94 is stopped in its raised position.

At the moment when carriage 79 reaches its first extreme position, it interrupts the light beam which is transmitted towards detector D3, whereby relays B10, B31 and B32 are de-energized. Relay B10, being de-energized, opens its contact CB10, causing de-energization of relay B07. In response to de-energization of relay B07, its contact CB07 opens to stop motor 88, whereby carriage 79 halts in its first extreme position. De-energization of relays B32 and B31 results in their contacts CB32 and CB31 being respectively closed and changed over to its rest position. A DC current then flows from the (+) terminal, through contact CB31 in the rest position and the closed contact CB42 to energize relay BP having contacts BP1 and BP2 (FIG. 6) that are thereby changed over to the working position. Because of this change of contacts BP1 and BP2, the current which had been previously causing motor 49 to hold carrier 28 in contact with screen 18 is reversed, causing motor 49 to drive the assembly formed by threaded spindle 39, plate 29, unit 27, platen 38 and carrier 28 downwardly.

During the downward movement of the assembly, plate 29 no longer interrupts the light beam which is transmitted towards detector D6, whereby an output voltage is derived from this detector to energize relay B04, which then opens its contact CB04. When, during the downward movement of plate 29, bar 99 again interrupts the light beam transmitted towards detector D7, the detector output voltage drops to de-energize relay B03, causing closure of its contact CB03.

When plate 29, as it arrives at its rest position, finally interrupts the light beam which is transmitted towards detector D5, the positive output voltage of this detector drops, causing de-energization of relays B11 and B28. De-energization of relay B11 causes its contact CB11 to open, which in turn de-energizes relays B01 and B02. Consequently, contacts CB01 and CB02 open; opening of contact CB02 cuts off the supply to motor 49, to immobilize plate 29 in its rest position. De-energization of relay B28, causes its contact CB28 to open, whereby relays B41, B42, B25, B19, and BC are de-energized. Relays B25, B41 and B42, being de-energized, open their respective contacts CB25, CB41 and CB42. Relay B19 being de-energized, closes its contact CB19. Relay BC, being de-energized, changes its contacts BC1 and BC2 over to the rest position.

Finally, the effect of contact CB42 opening is to de-energize relay BP, which then changes its contacts BP1 and BP2 over to the rest position. As soon as plate 29 has returned to its rest position, carrier 28, to which a layer of pasty material has been applied, can be removed by the operator and placed in an oven to enable the layer to solidify. The screen-printing apparatus is then ready to make a fresh application of pasty material. The fresh application may be made either to a carrier already coated with one or more solidified layers of insulating or conductive materials, or to a carrier to which no pasty material has been previously applied.

Although the description and the accompanying drawings relate to a preferred embodiment of the invention, it is understood that various modifications, additions, and substitutions which do not exceed the scope of the said invention may be made to suit particular cases and application, without affecting the principle of the invention. In particular, the relay circuitry of the control circuit, shown in FIGS. 6 and 7, could be wholly or partly replaced by any electronic circuitry which performs an equivalent function.

I claim:

1. Apparatus for printing onto a carrier by applying material to the carrier through a screen comprising support means for the screen, support means for the carrier, said carrier support means including a platen, said carrier support means being movable relative to said screen support means, and positioning means for controlling relative movement between the carrier and screen support means, said positioning means including: (1) guide means for providing translation in generally parallel planes between the carrier support means to control translation of the carrier support means toward and away from the screen support means, and (2) means for stopping the translation between said carrier support means and screen support means, said stopping means being coupled to said screen support means and said carrier support means, said stopping means positioning said platen and screen in predetermined substantially parallel planes where the material can be applied through the screen onto the carrier, said positioning means further comprising centering means coupled to said platen and said screen support means for centering said platen and said screen relative to each other, the screen having a pattern including a number of lines substantially parallel to a first predetermined direction, a blade having an elongated straight edge positioned for forcing the material through the screen onto the carrier, blade supporting and actuating means for displacing the blade edge in a plane parallel to the plane of the screen and in a second direction, said blade supporting and actuating means including means for adjusting said second direction to any angle with respect to said first direction, whereby the blade can slide parallel to said lines in the screen.

2. Apparatus according to claim 1 wherein blade supporting and actuating means includes means for controlling lowering of the blade towards the screen and for controlling the attitude on the blade on the screen.

3. Screen-printing apparatus comprising a screen essentially having a number of lines substantially parallel to a first predetermined direction, a blade, blade supporting and actuating means for displacing the blade on said screen in a second direction, said blade supporting and actuating means including means for adjusting said second direction to any angle with respect to said first direction, whereby the blade can slide parallel to said lines in the screen.

4. Apparatus according to claim 3 wherein said blade supporting and actuating means includes a frame supported by screen supporting means, and wherein said means for adjusting the direction of movement of the blade comprises means for rotating said frame about itself on said screen supporting means.

5. Apparatus according to claim 4 wherein said frame rotating means comprises a substantially annular plate mounted on said frame and having a ridge slidably mounted in a corresponding annular channel provided in said screen supporting means.

6. Apparatus for printing onto a carrier by applying material to the carrier through a planar screen, the screen having a pattern including a number of lines substantially parallel to a first predetermined direction, comprising means for mounting the screen and the carrier so material forced through the lines of the screen is deposited on the carrier in the same pattern as the pattern of the screen, a blade having an elongated, straight edge positioned for forcing the material through the screen onto the carrier, blade supporting and actuating means for displacing the blade edge in a plane parallel to the plane of the screen and in a second direction, said blade supporting and actuating means including means for adjusting said second direction to any angle with respect to said first direction, whereby the blade can slide parallel to said lines in the screen.

* * * * *